US012765038B2

(12) United States Patent
Liu

(10) Patent No.: US 12,765,038 B2
(45) Date of Patent: Oct. 13, 2026

(54) SEMICONDUCTOR DEVICE AND FABRICATING METHOD THEREOF

(71) Applicant: NANYA TECHNOLOGY CORPORATION, New Taipei City (TW)

(72) Inventor: Yu Hua Liu, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 370 days.

(21) Appl. No.: 18/493,049

(22) Filed: Oct. 24, 2023

(65) Prior Publication Data

US 2025/0133809 A1 Apr. 24, 2025

(51) Int. Cl.
*H10D 64/68* (2025.01)
*H10D 30/01* (2025.01)
*H10D 30/69* (2025.01)
*H10D 64/01* (2025.01)

(52) U.S. Cl.
CPC ....... *H10D 64/689* (2025.01); *H10D 30/0415* (2025.01); *H10D 30/701* (2025.01); *H10D 64/01* (2025.01)

(58) Field of Classification Search
CPC ............. H10D 64/689; H10D 30/0415; H10D 30/701; H10D 64/01
See application file for complete search history.

(56) References Cited

U.S. PATENT DOCUMENTS 9,373,677 B2 6/2016 Cissell et al.
2016/0380069 A1* 12/2016 Lee ...................... H10D 64/685 257/407
2018/0240803 A1* 8/2018 Yoo ........................ H10B 51/30
2018/0240804 A1* 8/2018 Yoo ........................ H10B 51/30
2018/0374929 A1* 12/2018 Yoo .................... H10D 30/0415
2020/0105770 A1* 4/2020 Yoo ........................ H10B 51/30
2021/0098618 A1* 4/2021 Hsu ...................... H10D 64/689
2022/0013353 A1* 1/2022 Lu ........................ H10D 64/033
2022/0285521 A1* 9/2022 Hsu ...................... H10D 64/017
2023/0022629 A1* 1/2023 Park ......................... H10D 1/68

(Continued)

FOREIGN PATENT DOCUMENTS

TW 201349343 A 12/2013
TW 201937742 A 9/2019

OTHER PUBLICATIONS

Sheng-Han Yi et al., "Modulation of ferroelectricity and antiferroelectricity of nanoscale ZrO2 thin films using ultrathin interfacial layers", Journal of the European Ceramic Society 39 (2019) 4038-4045.

(Continued)

*Primary Examiner* — Eugene Lee
(74) *Attorney, Agent, or Firm* — CKC & Partners Co., LLC

(57) ABSTRACT

A semiconductor device includes a semiconductor substrate and a gate structure. The semiconductor substrate has source/drain regions and a channel region between the source/drain regions. The gate structure is over the channel region of the semiconductor substrate. The gate structure includes an interfacial layer, a zirconium-containing dielectric layer, and a gate electrode. The zirconium-containing dielectric layer is over the interfacial layer and is in tetragonal-phase. The gate electrode is over the zirconium-containing dielectric layer.

14 Claims, 8 Drawing Sheets

(56) References Cited

U.S. PATENT DOCUMENTS

| | | | | |
|---|---|---|---|---|
| 2023/0099330 A1* | 3/2023 | Koo | .................. | H10D 30/6891<br>257/295 |
| 2024/0038890 A1* | 2/2024 | Heo | .................... | H10D 30/701 |

OTHER PUBLICATIONS

T. Ali et al.," Theory and Experiment of Antiferroelectric(AFE) Si-Doped Hafnium Oxide (HSO)Enhanced Floating-Gate Memory", IEEE Transactions on Electron Devices, vol. 66, No. 8, Aug. 2019, p. 3356-3364.

* cited by examiner

SEMICONDUCTOR DEVICE AND FABRICATING METHOD THEREOF

BACKGROUND

Field of Invention

The present disclosure relates to a semiconductor device and a fabricating method of the semiconductor device.

Description of Related Art

With the development of high-density and low-power integrated circuits (ICs), scaling of field effect transistors (FETs) is a vital issue. In the miniaturization of the field effect transistors, scaling down channel lengths and gate oxide thicknesses results in low applied voltages and high off-state currents ($I_{off}$). Furthermore, to keep favorable on-state currents ($I_{on}$) and gate control ability, shorter channel lengths and thinner gate oxide thicknesses are desirable. However, when the gate oxide thicknesses are reduced to a certain extent, the gate leakage will be too large to keep the gate control ability, especially in the case of traditional single $SiO_2$ gate insulator transistors.

Accordingly, how to provide a semiconductor device and a fabricating method of the semiconductor device to solve the aforementioned problems becomes an important issue to be solved by those in the industry.

SUMMARY

An aspect of the disclosure is to provide a semiconductor device and a fabricating method of the semiconductor device that may efficiently solve the aforementioned problems.

According to an embodiment of the disclosure, a semiconductor device includes a semiconductor substrate and a gate structure. The semiconductor substrate has source/drain regions and a channel region between the source/drain regions. The gate structure is over the channel region of the semiconductor substrate. The gate structure includes an interfacial layer, a zirconium-containing dielectric layer, and a gate electrode. The zirconium-containing dielectric layer is over the interfacial layer and is in tetragonal phase. The gate electrode is over the zirconium-containing dielectric layer.

In some embodiments of the present disclosure, the interfacial layer includes titanium oxide.

In some embodiments of the present disclosure, the zirconium-containing dielectric layer is in contact with the interfacial layer.

In some embodiments of the present disclosure, a thickness of the interfacial layer is in a range from about 5 Å to about 3 nm.

In some embodiments of the present disclosure, a thickness of the interfacial layer is in a range from about 1 Å to about 50 nm.

In some embodiments of the present disclosure, the gate electrode includes titanium nitride or tantalum nitride.

In some embodiments of the present disclosure, the zirconium-containing dielectric layer is nitrogen-doped.

In some embodiments of the present disclosure, the zirconium-containing dielectric layer has a top portion and a bottom portion opposing each other. The bottom portion is in contact with the interfacial layer. A nitrogen atomic concentration at the top portion is higher than a nitrogen atomic concentration at the bottom portion.

In some embodiments of the present disclosure, the gate structure further includes a diffusion barrier layer between the gate electrode and the zirconium-containing dielectric layer. The diffusion barrier layer includes aluminum oxide or titanium oxide.

In some embodiments of the present disclosure, the diffusion barrier layer includes a same material as the interfacial layer.

In some embodiments of the present disclosure, a thickness of the zirconium-containing dielectric layer is in a range from about 3 nm to about 7 nm.

In some embodiments of the present disclosure, a thickness of the zirconium-containing dielectric layer is in a range from about 1 Å to about 50 nm.

In some embodiments of the present disclosure, the zirconium-containing dielectric layer contains titanium atoms.

In some embodiments of the present disclosure, the interfacial layer includes a first interfacial layer and a second interfacial layer, wherein the first interfacial layer includes silicon oxide, and the second interfacial layer includes titanium oxide.

According to another embodiment of the disclosure, a fabricating method of a semiconductor device includes forming a gate structure over a channel region of a semiconductor substrate and forming source/drain regions in the semiconductor substrate and on opposite sides of the channel region. Forming the gate structure includes: depositing an interfacial layer over the channel region; depositing a zirconium-containing dielectric layer on the interfacial layer; and forming a gate electrode over the zirconium-containing dielectric layer. The zirconium-containing dielectric layer is in tetragonal phase.

In some embodiments of the present disclosure, the fabricating method further includes performing an annealing process at a temperature in a range from about 400° C. to about 900° C. after forming the gate electrode.

In some embodiments of the present disclosure, the fabricating method further includes performing an implantation process to the zirconium-containing dielectric layer with nitrogen.

In some embodiments of the present disclosure, the fabricating method further includes depositing a diffusion barrier layer over the zirconium-containing dielectric layer before forming the gate electrode. The diffusion barrier layer includes aluminum oxide or titanium oxide.

In some embodiments of the present disclosure, the fabricating method further includes: performing an implantation process to the zirconium-containing dielectric layer with nitrogen; and depositing a diffusion barrier layer over the zirconium-containing dielectric layer after performing the implantation process and before forming the gate electrode. The diffusion barrier layer includes aluminum oxide or titanium oxide.

In some embodiments of the present disclosure, depositing the interfacial layer includes: depositing a first interfacial layer made of silicon oxide; and depositing a second interfacial layer made of titanium oxide.

Accordingly, in the semiconductor device and the fabricating method of the semiconductor device of some embodiments of the present disclosure, by using a zirconium-containing dielectric layer as a gate insulator having antiferroelectric properties, the field-induced polarization helps attract more accumulated charge in the channel region. Also, the zirconium-containing dielectric layer has a high dielectric constant, which increases the oxide capacitance of the semiconductor device and mitigates gate leakage. To be more specific, the zirconium-containing dielectric layer contains tetragonal phase. Furthermore, by disposing an interfacial layer including titanium oxide between the zirconium-containing dielectric layer and the semiconductor substrate and/or performing an annealing process, the tetragonal-phase zirconium-containing dielectric is stabilized, improving the reliability of the semiconductor device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
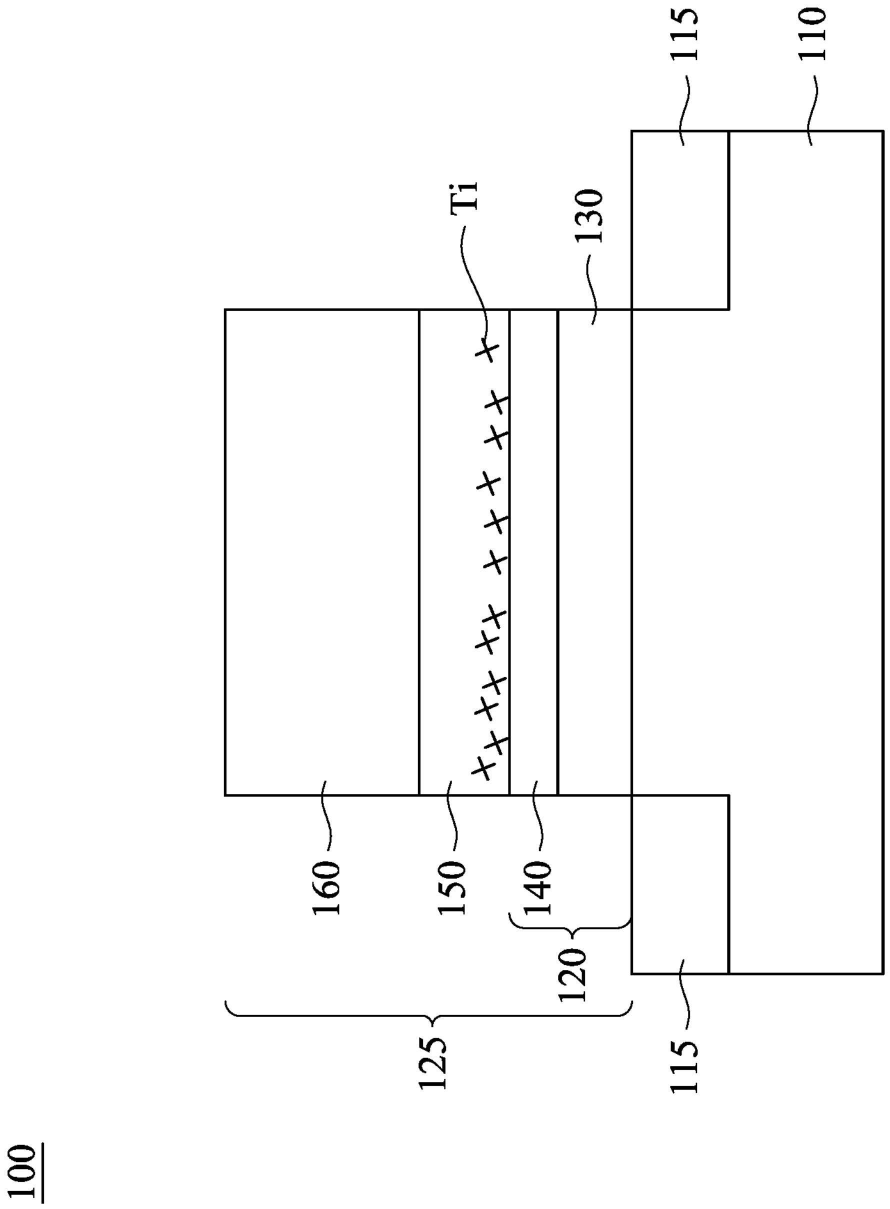
FIG. 1 is a schematic view of a semiconductor device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

By increasing integration density of field effect transistors (FETs), more circuits may be fabricated on one wafer and therefore each circuit may be cost down. Also, circuit speed may be improved and power consumption decreases. However, in the miniaturization of the field effect transistors, scaling down channel lengths and gate oxide thicknesses results in low applied voltages and high off-state currents ($I_{off}$). In some respects, low applied voltages are desirable since they increase on-state currents ($I_{on}$) and thereby improve circuit speed. In some other respects, the accompanying high off-state currents are not favorable, for they cause large gate leakage and deteriorate gate control. In turn, off-state currents should be kept as low as possible to minimize the static power a field effect transistor consumes when it is in a standby mode.

Take a field effect transistor with a single silicon oxide ($SiO_2$) gate insulator for example. A thinner $SiO_2$ gate insulator has larger oxide capacitance (Cox), which raises the on-state current of the resultant field effect transistor. However, as the thickness of the $SiO_2$ gate insulator decreases, leakage current shows a rapid rise. When the gate insulator is scaled down to a certain thickness, the leakage will be too large to maintain the gate control.

Therefore, in some embodiments of the present disclosure, the semiconductor devices incorporate novel oxide materials to enhance gate control while keeping the same physical oxide thickness.

Reference is made to FIG. 1. FIG. 1 is a schematic view of a semiconductor device 100 according to some embodiments of the present disclosure. As shown in FIG. 1, the semiconductor device 100 includes a semiconductor substrate 110 and a gate structure 125. The gate structure 125 includes an interfacial layer 120, a zirconium-containing dielectric layer 150, and a gate electrode 160. The interfacial layer 120 is disposed on the semiconductor substrate 110, in which the interfacial layer 120 includes a first interfacial layer 130 and a second interfacial layer 140 over the first interfacial layer 130. In detail, the first interfacial layer 130 is disposed on the semiconductor substrate 110. The second interfacial layer 140 is disposed on the first interfacial layer 130. The zirconium-containing dielectric layer 150 is disposed on the second interfacial layer 140. Moreover, a bottom portion of the zirconium-containing dielectric layer 150 is in contact with the second interfacial layer 140. The gate electrode 160 is disposed on the zirconium-containing dielectric layer 150.

As shown in FIG. 1, the semiconductor substrate 110 has source/drain regions 115 on opposite sides of the gate structure 125. Here, the portion of the semiconductor substrate 110 that is covered by the gate structure 125 and between the source/drain regions 115 can be referred to as a channel region. As such, the first interfacial layer 130 is disposed over the channel region of the semiconductor substrate 110. In some embodiments, the semiconductor substrate 110 may include dielectric materials, such as silicon oxide ($SiO_2$), silicon nitride (SiN), a combination thereof, or the like.

In some embodiments, the zirconium-containing dielectric layer 150 includes undoped zirconium oxide ($ZrO_2$), silicon-doped $ZrO_2$, aluminum-doped $ZrO_2$, lanthanum-doped $ZrO_2$, hafnium zirconium oxide ($HfZrO_2$, HZO), a combination thereof, or the like. The zirconium-containing dielectric layer 150 is in tetragonal phase, such as tetragonal zirconium oxide (tetragonal $ZrO_2$). In some embodiments, a thickness of the zirconium-containing dielectric layer 150 is in a range from about 1 Å to about 50 nm. In some embodiments, a thickness of the zirconium-containing dielectric layer 150 is in a range from about 3 Å to about 7 nm.

In some embodiments, the gate electrode 160 includes metal nitride or metal carbide. In some embodiments, the gate electrode 160 includes at least one of titanium nitride (TiN) and tantalum nitride (TaN). In some embodiments, the gate electrode 160 includes tungsten nitride (WN).

In the semiconductor device 100, the zirconium-containing dielectric layer 150 acts as a gate insulator. The zirconium-containing dielectric layer 150 has a high dielectric constant (high-k) and provides high permittivity. Compared to traditional single $SiO_2$ gate insulator transistors, the zirconium-containing dielectric layer 150 may have a greater oxide capacitance while keeping the same physical oxide thickness, which will be beneficial for increasing on-state current of the semiconductor device 100.

As mentioned above, the zirconium-containing dielectric layer 150 may include tetragonal-phase. The tetragonal-phase will lead to the zirconium-containing dielectric layer 150 having antiferroelectric (AFE) properties. In antiferroelectric materials, spontaneous polarization dipoles are aligned in opposite directions in adjacent sublattices. Thus, double hysteresis loops with negligible remanent polarization at zero biased voltage are exhibited in the polarization-electric field characteristics of the zirconium-containing dielectric layer 150. Such zirconium-containing dielectric layer 150 may be applied to volatile memory devices. The field-induced polarization helps attract more accumulated charge in the channel region. In some embodiments, one of the double hysteresis loops may be shifted to be centered with an applied voltage of 0V. As such, the polarization may exist in the form of a built-in electric field, which makes it viable to use the zirconium-containing dielectric layer 150 as a gate insulator for a nonvolatile memory device.

Furthermore, with a tetragonal $ZrO_2$ gate insulator having antiferroelectric properties, gate leakage may be alleviated and direct tunneling caused by insufficient thicknesses of traditional gate insulators may be suppressed. This demonstrates the capability of $ZrO_2$ to further scale the equivalent oxide thickness (EOT) of the gate insulator.

In some embodiments, the first interfacial layer 130 includes silicon oxide. In some embodiments, a thickness of the first interfacial layer 130 is in a range from about 1 Å to about 50 nm. In some embodiments, a thickness of the first interfacial layer 130 is in a range from about 5 Å to about 3 nm.

In some embodiments, the second interfacial layer 140 includes titanium oxide ($TiO_2$). For example, the second interfacial layer 140 includes anatase $TiO_2$ or rutile $TiO_2$. In such embodiments, a lattice constant (or a unit cell dimension) of $TiO_2$ is different from that of $ZrO_2$. This lattice mismatch at the boundaries of $TiO_2$ and $ZrO_2$ can induce compressive strain to unit cells of $ZrO_2$ during the fabrication of the semiconductor device 100 and lead to the formation of $ZrO_2$ in tetragonal phase. Due to different strain imposed to different portions of the zirconium-containing dielectric layer 150, the proportions of tetragonal zirconium oxide in these portions may vary with their distances from the interface of the second interfacial layer 140 and the zirconium-containing dielectric layer 150 along a direction that is perpendicular to the interface. For example, in some embodiments, the proportion of tetragonal zirconium oxide in the bottom portion may be higher than that in a top portion of the zirconium-containing dielectric layer 150.

In some embodiments, the bottom portion of the zirconium-containing dielectric layer 150 may contain titanium atoms (Ti) because of inter-diffusion occurred at the interface between the second interfacial layer 140 and the zirconium-containing dielectric layer 150. Distribution of the titanium atoms are shown with the crosses in FIG. 1. In some embodiments, the titanium atomic concentration may decrease from the bottom portion of the zirconium-containing dielectric layer 150 toward the top portion of the zirconium-containing dielectric layer 150. The titanium atoms may exist in the form of titanium or titanium oxide. In some embodiments, $TiO_2/ZrO_2$ solid solution exists at the interface between the second interfacial layer 140 and the bottom portion of the zirconium-containing dielectric layer 150, forming a transition layer (not shown).

In some embodiments, a thickness of the second interfacial layer 140 is in a range from about 1 Å to about 50 nm. In some embodiments, a thickness of the second interfacial layer 140 is in a range from about 5 Å to about 3 nm.

Figure 2:
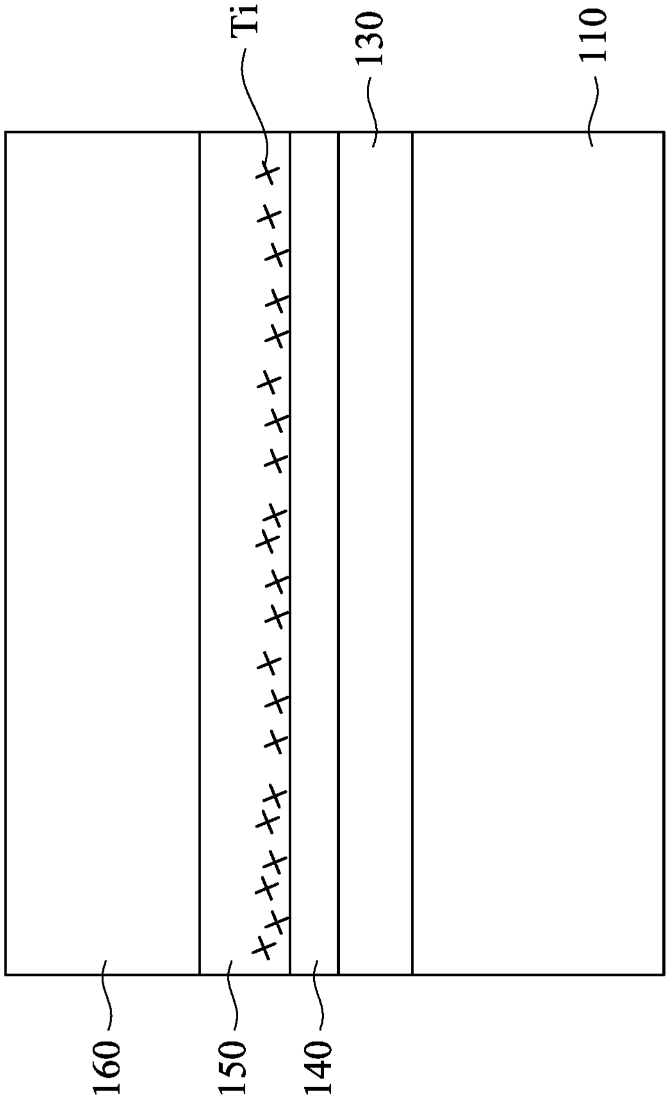
FIG. 2 is a schematic view of an intermediate stage of a fabricating method for forming a semiconductor device according to some embodiments of the present disclosure.
Figure 3:
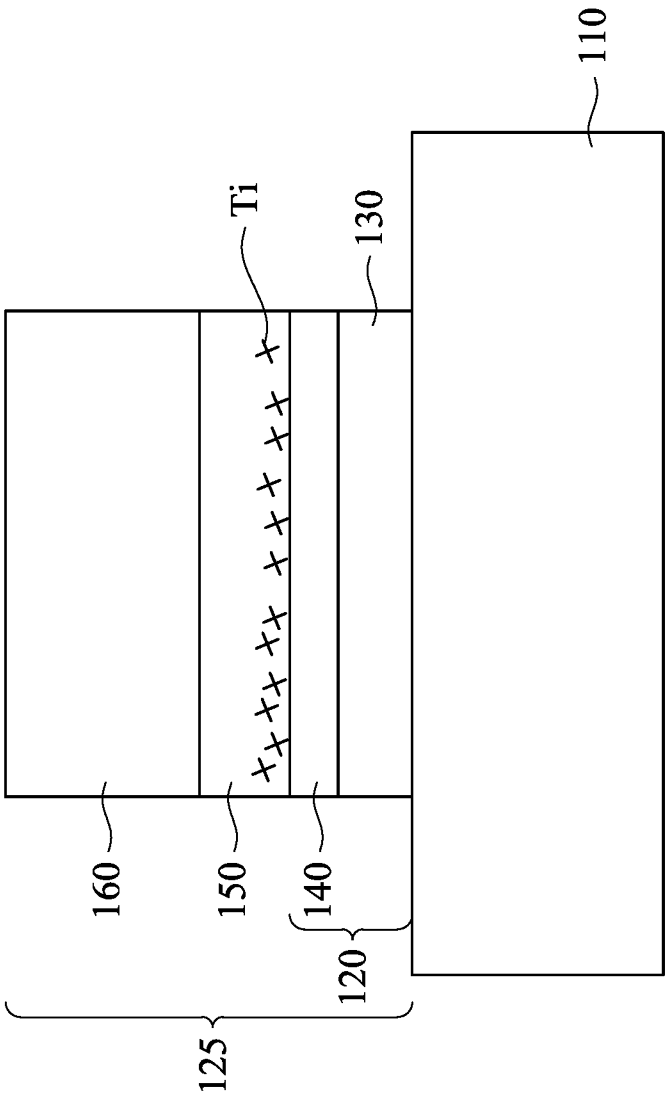
FIG. 3 is a schematic view of an intermediate stage of a fabricating method for forming a semiconductor device according to some embodiments of the present disclosure.

Reference is made to FIG. 2 and FIG. 3. FIG. 2 and FIG. 3 are schematic views of intermediate stages of a fabricating method for forming the semiconductor device 100 according to some embodiments of the present disclosure. Each step of the fabricating method will be described with the accompanying drawings in the following paragraphs.

First, a semiconductor substrate 110 as shown in FIG. 2 is provided. As aforementioned, the semiconductor substrate 110 may include silicon oxide, silicon nitride, a combination thereof, or the like.

Later, the first interfacial layer 130, the second interfacial layer 140, the zirconium-containing dielectric layer 150, and the gate electrode 160 are formed, as shown in FIG. 2. In some embodiments, atomic layer deposition (ALD) is used for forming the layers for finely tuned control of layer thicknesses. For example, plasma-enhanced ALD (PEALD) or thermal ALD may be used. In some embodiments, the first interfacial layer 130 includes silicon oxide. In some embodiments, the second interfacial layer 140 includes titanium oxide.

As aforementioned, in embodiments that the second interfacial layer 140 contains titanium oxide ($TiO_2$) and the zirconium-containing dielectric layer 150 contains zirconium oxide ($ZrO_2$), the lattice mismatching of $TiO_2$ and $ZrO_2$ results in the formation of tetragonal $ZrO_2$. To be more specific, in some embodiments, the ALD process for depositing the zirconium-containing dielectric layer 150 is performed at a temperature in a range from about 200° C. to about 400° C.

Inter-diffusion may occur at the interface between the formed $ZrO_2$ and the underlying $TiO_2$. Therefore, the bottom portion of the zirconium-containing dielectric layer 150 that is in contact with the second interfacial layer 140 may contain titanium atoms. Distribution of the titanium atoms are shown with the crosses in FIG. 2. The titanium atoms may exist in the form of titanium or titanium oxide.

In some embodiments, to ensure the formation of tetragonal zirconium oxide, a thickness of the second interfacial layer 140 is in a range from about 1 Å to about 50 nm and a thickness of the zirconium-containing dielectric layer 150 is in a range from about 1 Å to about 50 nm. In some embodiments, a thickness of the second interfacial layer 140 is in a range from about 5 Å to about 3 nm and a thickness of the zirconium-containing dielectric layer 150 is in a range from about 3 Å to about 7 nm.

Next, as shown in FIG. 3, the intermediate structure of FIG. 2 is patterned to form the gate structure 125. In some embodiments, the patterning process may include, for example, forming a patterned mask over the intermediate structure of FIG. 2, performing an etching process to remove portions of the first interfacial layer 130, the second interfacial layer 140, the zirconium-containing dielectric layer 150, and the gate electrode 160 that are exposed through the patterned mask, and then removing the patterned mask once the etching process is complete.

Then, the source/drain regions 115 are formed in the exposed regions of the semiconductor substrate 110. In some embodiments, the source/drain regions 115 may be formed by a suitable implantation process. For example, N-type dopants may be implanted in the semiconductor substrate 110 for N-type semiconductor devices, while P-type dopants may be implanted in the semiconductor substrate 110 for P-type semiconductor devices.

Finally, in some embodiments, to stabilize the tetragonal zirconium oxide in the zirconium-containing dielectric layer 150 and improving the reliability of the semiconductor device 100, an annealing process may be performed by rapid thermal annealing. FIG. 1 is referred back to show the resultant structure of the semiconductor device 100.

With titanium atoms diffused into the zirconium-containing dielectric layer 150, stabilization temperature for annealing may be lowered. For example, the semiconductor device obtained in FIG. 1 is annealed at a temperature in a range from about 400° C. and about 900° C. In some embodiments, the annealing process lasts about 10 seconds to about 3 minutes. In some embodiments, the annealing process is performed in a nitrogen gas atmosphere.

As aforementioned, the gate electrode 160 may include titanium nitride or tantalum nitride. However, inter-diffusion may occur at the interface between the zirconium-containing dielectric layer 150 and the gate electrode 160. This may damage tetragonal zirconium oxide grains in the zirconium-containing dielectric layer 150. Therefore, to suppress the inter-diffusion, some embodiments of the present disclosure provide performing a passivation treatment to the zirconium-containing dielectric layer 150, while some other embodiments of the present disclosure provide forming a diffusion barrier layer between the zirconium-containing dielectric layer 150 and the gate electrode 160, which will be discussed later.

Figure 4:
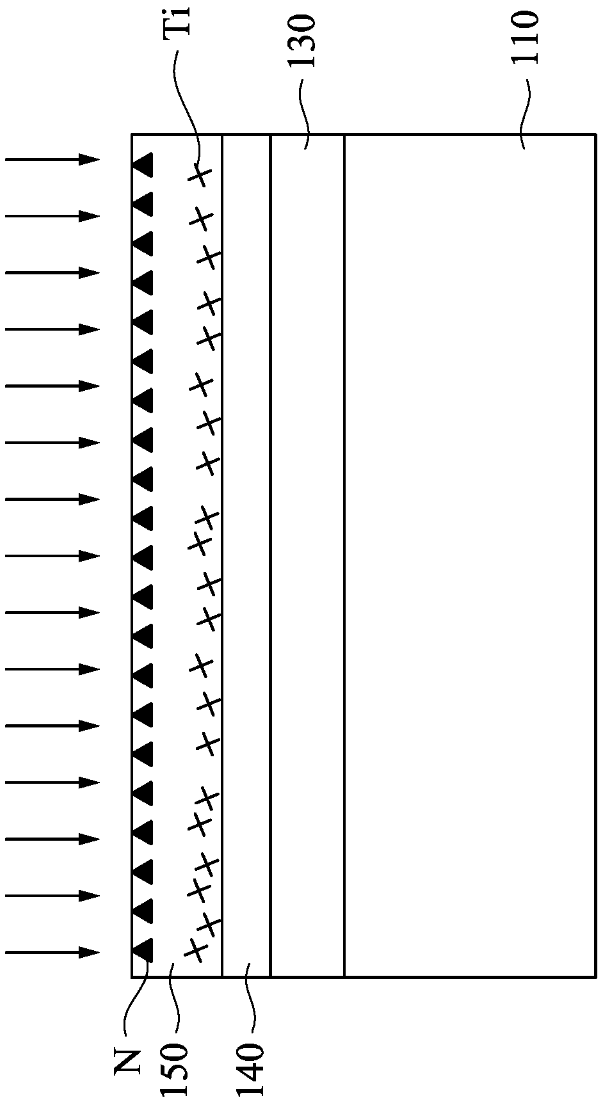
FIG. 4 is a schematic view of an intermediate stage of a fabricating method for forming a semiconductor device according to some other embodiments of the present disclosure.
Figure 5:
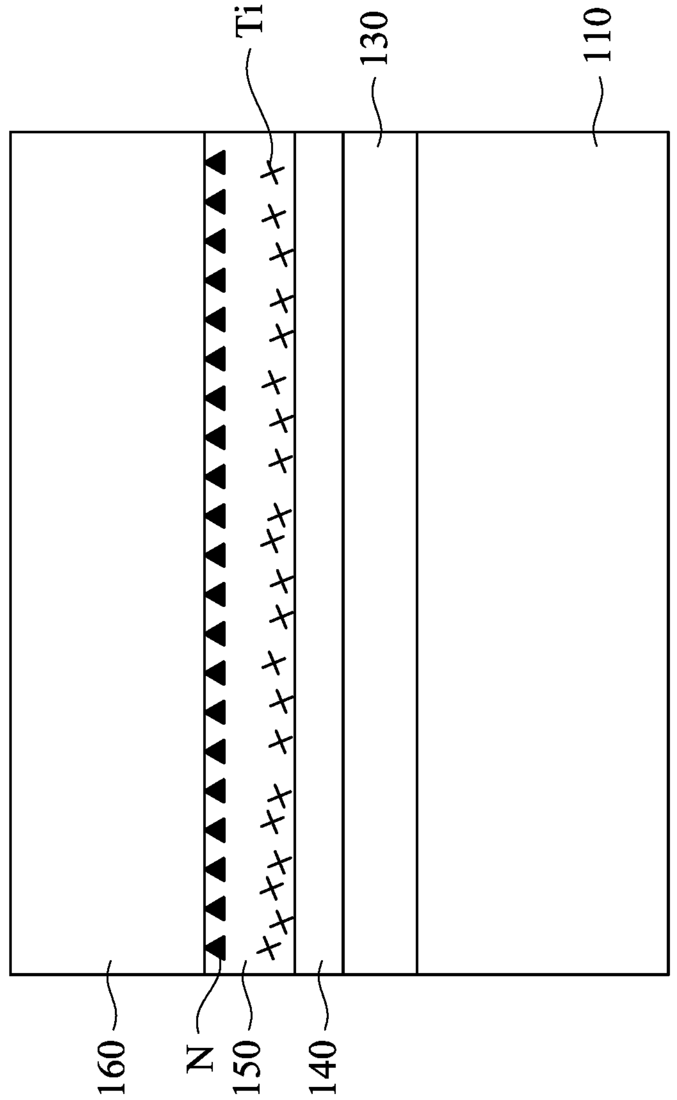
FIG. 5 is a schematic view of an intermediate stage of a fabricating method for forming a semiconductor device according to some other embodiments of the present disclosure.
Figure 6:
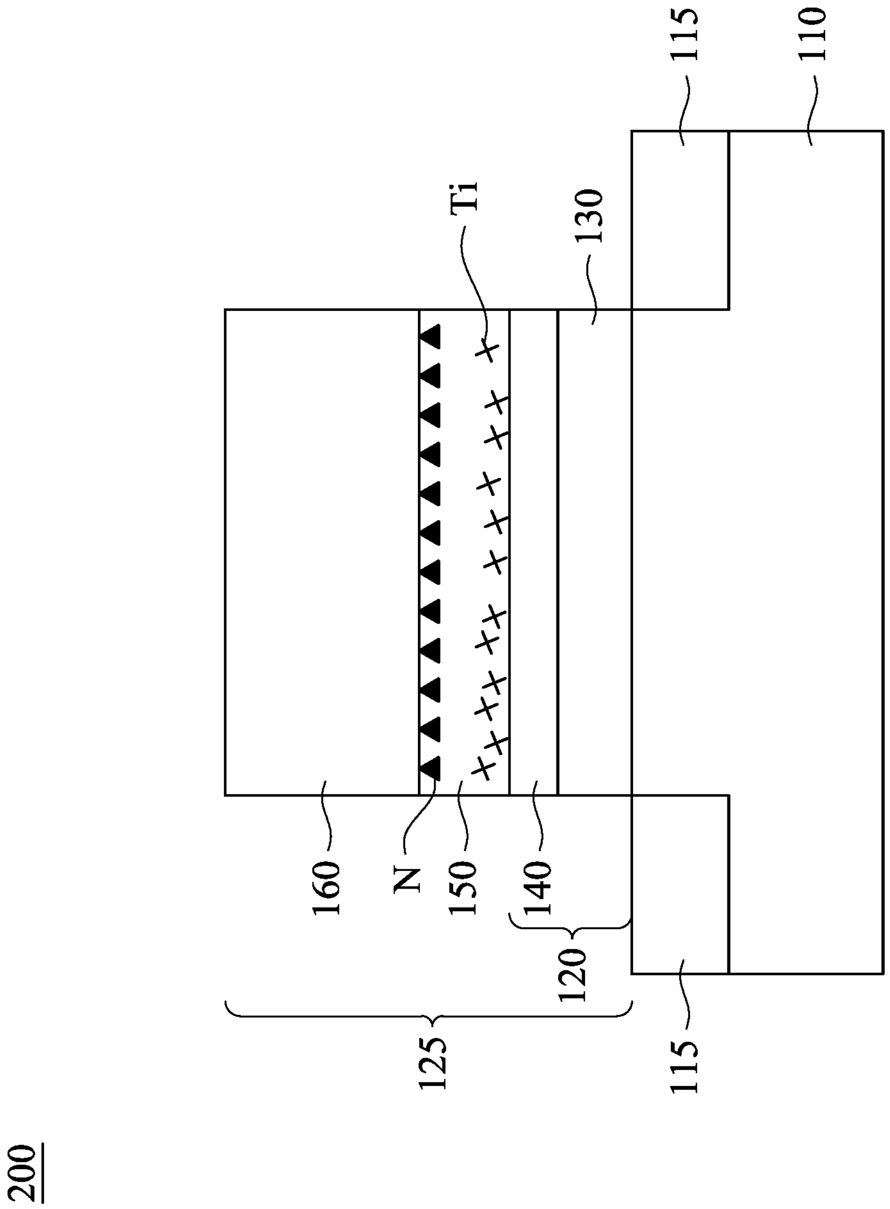
FIG. 6 is a schematic view of a semiconductor device according to some other embodiments of the present disclosure.

Reference is made to FIG. 4 to FIG. 6. FIG. 4 and FIG. 5 are schematic views of intermediate stages of a fabricating method according to some other embodiments of the present disclosure. FIG. 6 is a schematic view of a semiconductor device 200 formed by the fabricating method according to some other embodiments of the present disclosure.

Reference is made to FIG. 4. In some embodiments, after the zirconium-containing dielectric layer 150 is deposited, an implantation process is performed to the zirconium-containing dielectric layer 150. As shown in FIG. 4, the intermediate structure is doped with suitable impurities as shown with the colored triangles in FIG. 4. In some embodiments, the zirconium-containing dielectric layer 150 is doped with nitrogen (N) atoms (or “nitriding”). Because the implantation process is performed on the top surface of the zirconium-containing dielectric layer 150, the nitrogen atomic concentration at the top portion of the zirconium-containing dielectric layer 150 may be higher than the nitrogen atomic concentration at the bottom portion of the zirconium-containing dielectric layer 150.

Reference is made to FIG. 5. Next, the gate electrode 160 is formed on the doped zirconium-containing dielectric layer 150.

Reference is made to FIG. 6. The first interfacial layer 130, the second interfacial layer 140, the zirconium-containing dielectric layer 150, and the gate electrode 160 are patterned to form the gate structure 125. Then, the source/drain regions 115 are formed. As a result, the semiconductor device 200 is formed.

To further suppress the diffusion, a diffusion barrier may be disposed between the zirconium-containing dielectric layer 150 and the gate electrode 160, according to yet some other embodiments of the present disclosure as will be discussed in the following paragraphs with FIG. 7 and FIG. 8.

Figure 7:
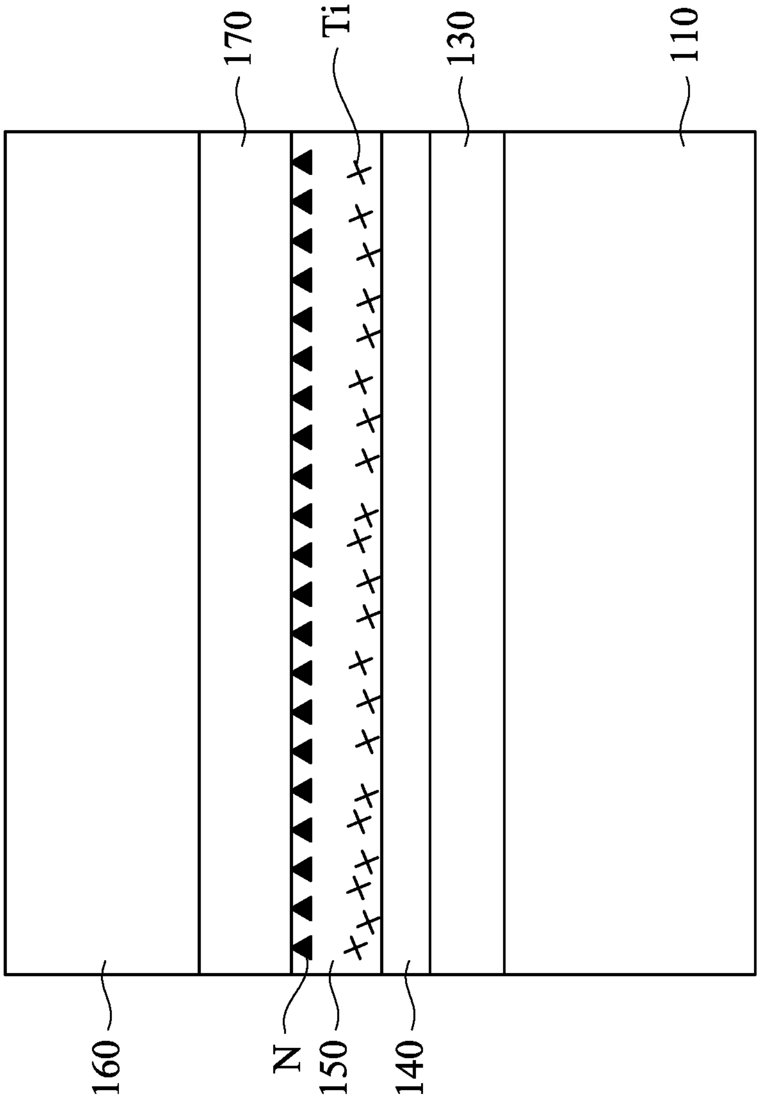
FIG. 7 is a schematic view of an intermediate stage of a fabricating method according to yet some other embodiments of the present disclosure.
Figure 8:
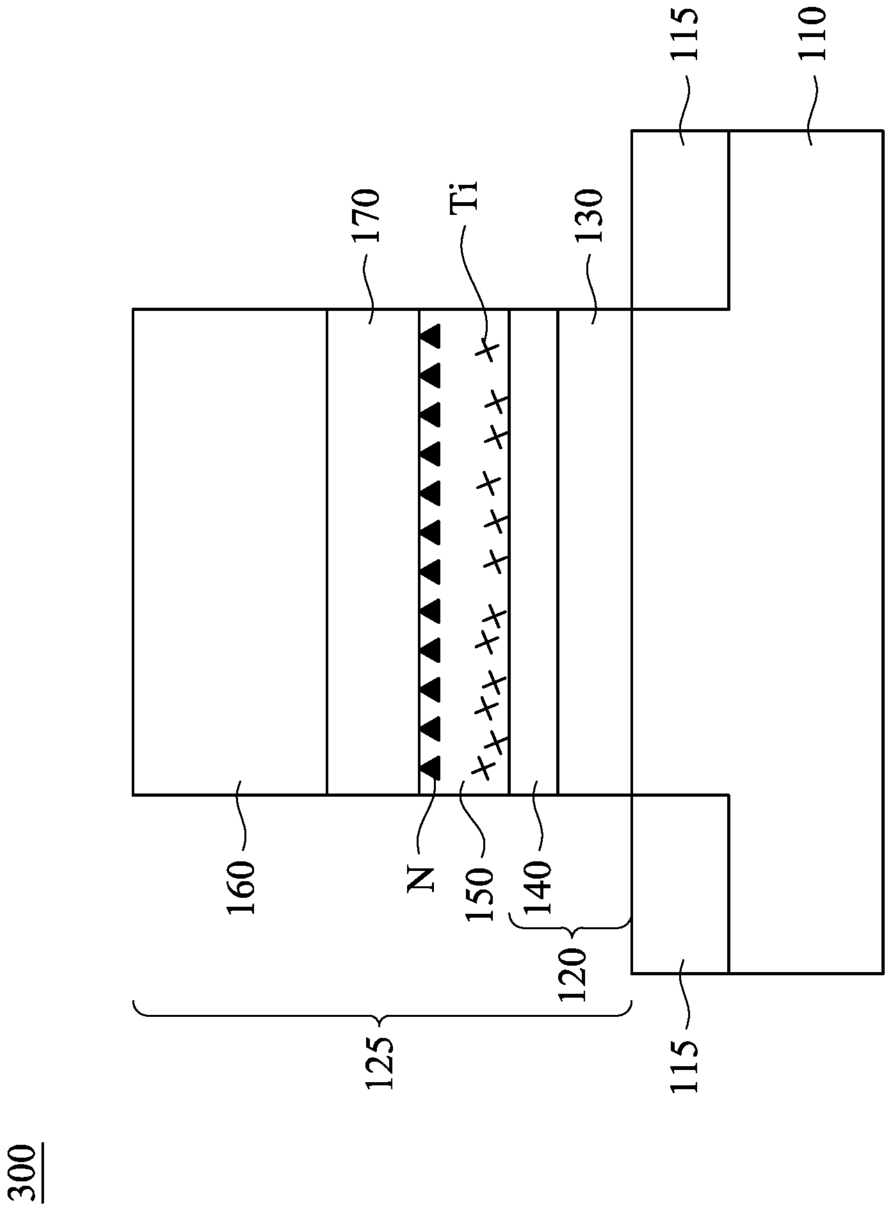
FIG. 8 is a schematic view of a semiconductor device according to yet some other embodiments of the present disclosure.

Reference is made to FIG. 7 and FIG. 8. FIG. 7 is a schematic view of an intermediate stage of a fabricating method according to yet some other embodiments of the present disclosure. FIG. 8 is a schematic view of a semiconductor device 300 formed by the fabricating method according to yet some other embodiments of the present disclosure.

Reference is made to FIG. 7. In this embodiment, a diffusion barrier layer 170 is formed after forming the zirconium-containing dielectric layer 150 and before forming the gate electrode 160, as shown in FIG. 7. In some embodiments, the diffusion barrier layer 170 is in contact with the zirconium-containing dielectric layer 150. In some embodiments, the diffusion barrier layer 170 includes aluminum oxide ($Al_2O_3$) or titanium oxide ($TiO_2$). In some embodiments, the diffusion barrier layer 170 includes a same material as the second interfacial layer 140. For example, the diffusion barrier layer 170 and the second interfacial layer 140 include titanium oxide ($TiO_2$). In such embodiments, the lattice mismatch exists at the interface of the zirconium-containing dielectric layer 150 and the diffusion barrier layer 170 containing titanium oxide as well. Therefore, the proportion of tetragonal zirconium oxide in the bottom portion of the zirconium-containing dielectric layer 150 is substantially the same as that in the top portion. In some embodiments, the thickness of the zirconium-containing dielectric layer 150 allows the formation of $ZrO_2$ in monoclinic phase in portions of the zirconium-containing dielectric layer 150 that are disposed between the top portion and the bottom portion, for theses portions are more distant from the interfaces of the zirconium-containing dielectric layer 150 and the $TiO_2$-containing layers and are less affected by strains from the lattice mismatch.

In some embodiments, the diffusion barrier layer 170 includes a first layer of aluminum oxide and a second layer of titanium oxide. For example, the first layer of aluminum oxide is deposited on the zirconium-containing dielectric layer 150, and then the second layer of titanium oxide is deposited on the first layer of aluminum oxide. In some embodiments, the diffusion barrier layer 170 comprises titanium atoms.

Reference is made to FIG. 8. Similarly, after forming the gate electrode 160, patterning, and forming the source/drain regions 115, the semiconductor device 300 is formed. Compared to the gate structure 125 of the semiconductor device 200 in FIG. 6, the gate structure 125 of the semiconductor device 300 further includes the diffusion barrier layer 170, as shown in FIG. 8. The gate electrode 160 is in contact with the diffusion barrier layer 170. By disposing the diffusion barrier layer 170 containing aluminum oxide and/or titanium oxide between the gate electrode 160 containing titanium nitride and/or tantalum nitride and the zirconium-containing dielectric layer 150 containing zirconium oxide, the diffusion of oxygen from zirconium oxide ($ZrO_2$) toward titanium nitride (TiN) or tantalum nitride (TaN) may be reduced, thereby suppressing the formation of secondary interfacial oxides, such as titanium oxynitride (TiON).

Accordingly, in the semiconductor device and the fabricating method of the semiconductor device of some embodiments of the present disclosure, by using a zirconium-containing dielectric layer as a gate insulator having antiferroelectric properties, the field-induced polarization helps attract more accumulated charge in the channel region. Also, the zirconium-containing dielectric layer has a high dielectric constant, which increases the oxide capacitance of the semiconductor device and mitigates gate leakage. To be more specific, the zirconium-containing dielectric layer contains tetragonal-phase. Furthermore, by disposing an interfacial layer including titanium oxide between the zirconium-containing dielectric layer and the semiconductor substrate and/or performing an annealing process, the tetragonal-phase zirconium-containing dielectric is stabilized, improving the reliability of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A fabricating method of a semiconductor device, comprising:

forming a gate structure over a channel region of a semiconductor substrate, wherein forming the gate structure comprises:

depositing an interfacial layer over the channel region;

depositing a zirconium-containing dielectric layer on the interfacial layer, wherein the zirconium-containing dielectric layer is in tetragonal-phase; and forming a gate electrode over the zirconium-containing dielectric layer;

performing an implantation process to the zirconium-containing dielectric layer with nitrogen, wherein the zirconium-containing dielectric layer has a top portion and a bottom portion opposing each other, and the bottom portion is in contact with the interfacial layer, wherein the implantation process is performed such that a nitrogen atomic concentration at the top portion is higher than a nitrogen atomic concentration at the bottom portion; and forming source/drain regions in the semiconductor substrate and on opposite sides of the channel region.

2. The fabricating method of claim 1, further comprising: performing an annealing process at a temperature in a range from about 400° C. to about 900° C. after forming the gate electrode.

3. The fabricating method of claim 1, further comprising: depositing a diffusion barrier layer over the zirconium-containing dielectric layer before forming the gate electrode, wherein the diffusion barrier layer comprises aluminum oxide or titanium oxide.

4. The fabricating method of claim 1, further comprising: depositing a diffusion barrier layer over the zirconium-containing dielectric layer after performing the implantation process and before forming the gate electrode, wherein the diffusion barrier layer comprises aluminum oxide or titanium oxide.

5. The fabricating method of claim 1, wherein depositing the interfacial layer comprises:

depositing a first interfacial layer made of silicon oxide; and depositing a second interfacial layer made of titanium oxide.

6. The fabricating method of claim 1, wherein a thickness of the interfacial layer is in a range from about 5 Å to about 3 nm.

7. The fabricating method of claim 1, wherein a thickness of the interfacial layer is in a range from about 1 Å to about 50 nm.

8. The fabricating method of claim 1, wherein a thickness of the zirconium-containing dielectric layer is in a range from about 3 nm to about 7 nm.

9. The fabricating method of claim 1, wherein a thickness of the zirconium-containing dielectric layer is in a range from about 1 Å to about 50 nm.

10. The fabricating method of claim 1, wherein depositing the interfacial layer comprises:

depositing a first interfacial layer over the channel region; and depositing a second interfacial layer on the first interfacial layer and comprising a different material than the first interfacial layer.

11. The fabricating method of claim 10, further comprising:

depositing a diffusion barrier layer over the zirconium-containing dielectric layer after performing the implantation process and before forming the gate electrode, wherein the diffusion barrier layer comprises a same material as the second interfacial layer.

12. The fabricating method of claim 1, wherein depositing the interfacial layer comprises:

depositing a first interfacial layer made of silicon oxide; and depositing a second interfacial layer made of titanium oxide, wherein the bottom portion of the zirconium-containing dielectric layer is in contact with the second interfacial layer.

13. The fabricating method of claim 1, wherein a titanium atom is present at the bottom portion of the zirconium-containing dielectric layer.

14. The fabricating method of claim 5, wherein the zirconium-containing dielectric layer is in contact with the second interfacial layer.

* * * * *